(12) United States Patent
Chung et al.

(10) Patent No.: US 11,850,805 B2
(45) Date of Patent: Dec. 26, 2023

(54) METHOD FOR MANUFACTURING PDMS DEVICE AND PDMS DEVICE MANUFACTURED THEREBY

(71) Applicant: SEOUL NATIONAL UNIVERSITY R&DB FOUNDATION, Seoul (KR)

(72) Inventors: Taek Dong Chung, Seoul (KR); Young-Chang Joo, Seoul (KR); Jeong-Yun Sun, Seoul (KR); Seok Hee Han, Seoul (KR); Sung Il Kim, Seoul (KR); Hae-Ryung Lee, Seoul (KR); Seung-Min Lim, Seoul (KR)

(73) Assignee: SEOUL NATIONAL UNIVERSITY R & DB FOUNDATION, Seoul (KR)

( * ) Notice: Subject to any disclaimer, the term of this patent is extended or adjusted under 35 U.S.C. 154(b) by 29 days.

(21) Appl. No.: 17/365,105

(22) Filed: Jul. 1, 2021

(65) Prior Publication Data
US 2022/0063211 A1  Mar. 3, 2022

(30) Foreign Application Priority Data
Aug. 25, 2020 (KR) .......................... 10-2020-0106660

(51) Int. Cl.
| | | |
|---|---|---|
| *B29C 65/00* | (2006.01) | |
| *C08L 83/04* | (2006.01) | |
| *C08G 77/392* | (2006.01) | |
| *B29C 35/08* | (2006.01) | |
| *C08G 77/38* | (2006.01) | |
| *H01L 29/66* | (2006.01) | |

(52) U.S. Cl.
CPC ........ *B29C 66/026* (2013.01); *B29C 35/0805* (2013.01); *B29C 66/712* (2013.01); *B29C 66/72* (2013.01); *B29C 66/723* (2013.01); *B29C 66/7316* (2013.01); *C08G 77/38* (2013.01); *C08G 77/392* (2013.01); *C08L 83/04* (2013.01); *B29C 2035/0827* (2013.01); *C08L 2203/20* (2013.01); *H01L 29/66136* (2013.01)

(58) Field of Classification Search
CPC . C08L 83/04; B29C 66/72; B29C 2035/0827; B29C 66/7316; B29C 66/723; B29C 66/712; B29C 35/0805; B29C 66/026; C08G 77/392; C08G 77/38
See application file for complete search history.

(56) References Cited

U.S. PATENT DOCUMENTS

| | | | |
|---|---|---|---|
| 2018/0201735 A1* | 7/2018 | Czaplewski | ......... C09D 183/04 |
| 2020/0263045 A1* | 8/2020 | Wang | ..................... C08G 77/20 |
| 2021/0246270 A1* | 8/2021 | Park | ..................... A61L 26/0066 |

* cited by examiner

Primary Examiner — Vishal I Patel
(74) Attorney, Agent, or Firm — Hauptman Ham, LLP

(57) ABSTRACT

A method for manufacturing a PDMS device in accordance with an exemplary embodiment of the present invention surface treats the entire surface of a pattern with a thiol group (—SH), so that a hydrogel may be connected to the surface of the pattern by a covalent bond under ultraviolet rays. Therefore, a PDMS device manufactured by the above method has an advantage in that the shape thereof may be stably maintained without the swelling or desorption of a hydrogel even when an electrolyte is filled in a pattern.

7 Claims, 10 Drawing Sheets

FIG. 1

```
PREPARE FIRST PDMS SUBSTRATE AND SECOND PDMS SUBSTRATE AT
LEAST ONE OF WHICH HAVING PATTERN FORMED THEREON
```
⬇
```
INTRODUCE -OH GROUP ON SURFACE OF FIRST PDMS SUBSTRATE
AND SURFACE OF SECOND PDMS SUBSTRATE
```
⬇
```
INTRODUCE THIOL GROUP(-SH) ON SURFACE OF FIRST PDMS
SUBSTRATE, AND INTRODUCE EPOXIDE ON SURFACE OF SECOND
PDMS SUBSTRATE
```
⬇
```
ALLOW FIRST PDMS SUBSTRATE AND SECOND PDMS SUBSTRATE TO
COME INTO CONTACT TO FORM PDMS STRUCTURE
```
⬇
```
SUBSTITUTE EPOXIDE PRESENT ON SURFACE OF PATTERN OF PDMS
STRUCTURE WITH THIOL GROUP
```

METHOD FOR MANUFACTURING PDMS DEVICE AND PDMS DEVICE MANUFACTURED THEREBY

CROSS-REFERENCE TO RELATED APPLICATION

This application claims priority to Korean Patent Application No. 10-2020-0106660 filed on Aug. 25, 2020 and all the benefits accruing therefrom under 35 U.S.C. § 119, the contents of which are incorporated by reference in their entirety.

BACKGROUND

The present disclosure relates to a method for manufacturing a PDMS element, and a PDMS element manufactured thereby.

Devices constituting a typical electronic product operate through the flow of electrons using a metal line. On the other hand, ionic devices, which have been in development in recent years, operate through the flow of ions in an electrolyte environment, such as a living body.

A representative example of ionic devices is a hydrogel ionic device using a hydrogel and an electrolyte having fixed charges thereinside. A hydrogel ionic device as described above is prepared by forming a fine pattern on a substrate, and filling the pattern with an electrolyte and a hydrogel. Depending on the design of the electrolyte and the hydrogel, the hydrogel ionic device is used as a diode, a transistor, or the like. For the stable operation of the hydrogel ionic device, it is necessary that the surface of the substrate is hydrophilic, and at the same time, the surface modification thereof is easy. Therefore, glass is widely used as the substrate of a hydrogel ionic device.

Although glass is transparent and non-toxic, and thus, has advantages of being able to be used as a biodevice, but on the contrary, glass has properties of being hard and breakable, so that there is a problem in that it is difficult to apply glass to a biodevice field.

Therefore, there is a need for a device made of a new material, the device which has the advantages of glass, yet is not breakable at the same time, so that the processing thereof is facilitated, and furthermore, which has flexibility, elasticity, and biocompatibility.

SUMMARY

The present disclosure provides a method for manufacturing a PDMS device, which is an ionic device, and a PDMS device manufactured by the manufacturing method, wherein the PDMS device is manufactured by using polydimethylsiloxane (PDMS) which has advantages of biocompatibility, flexibility, air permeability, and the like, while having advantages of glass, such as transparency, non-toxicity, and the like.

Meanwhile, other objects of the present invention that are not specified will be further considered within the scope that can be easily derived from the following detailed description and the effects thereof.

In accordance with an exemplary embodiment of the present invention, a method for manufacturing a PDMS device includes (a) preparing a first PDMS substrate and a second PDMS substrate at least one of which has a pattern formed thereon, (b) introducing a —OH group on the surface of the first PDMS substrate and the surface of the second PDMS substrate, (c) introducing a thiol group (—SH) on the surface of the first PDMS substrate, and introducing an epoxide on the surface of the second PDMS substrate, (d) bonding the first PDMS substrate and the second PDMS substrate to form a PDMS structure, and (e) substituting the epoxide present on the surface of the pattern of the PDMS structure with a thiol group.

In an embodiment, Step (b) may be performed by irradiating the first may be and the second PDMS substrate with ultraviolet rays in an ozone atmosphere.

In an embodiment, the introducing of a thiol group (—SH) on the surface of the first PDMS substrate in Step (c) may be performed by dissolving at least one selected from the group consisting of (3-Mercaptopropyl)trimethoxysilane, (3-Mercaptopropyl)trimethoxy-d9-silane, and Bis[3-(triethoxysilyl)propyl]tetrasulfide in a solvent, and then immersing the first PDMS substrate therein.

In an embodiment, the introducing of an epoxide on the surface of the may be substrate in Step (c) may be performed by dissolving at least one selected from the group consisting of (3-Glycidyloxypropyl)trimethoxysilane and Diethoxy(3-glycidyloxypropyl)methylsilane in a solvent, and then immersing the second PDMS substrate therein.

In an embodiment, Step (e) may be one in which a compound having 2 or more thiol groups (—SH) is dissolved together with a base in a solvent, and then allowed to come into contact with the pattern, thereby introducing a thiol group while the epoxide ring is opened.

In an embodiment, the compound having 2 or more thiol groups (—SH) may be at least one selected from the group consisting of 1,2-Ethanedithiol, Propanedithiol, 2,3-Dimercapto-1-propanol, Poly(ethylene glycol)dithiolm and 4,4ç, and the base may be at least one selected from the group consisting of 1,8-Diazabicyclo[5.4.0]undec-7-ene, and 1,5-Diazabicyclo[4.3.0]non-5-ene.

In an embodiment, after Step (e) is performed, injecting an aqueous solution of a hydrogel monomolecular aqueous solution at one position of the pattern, and then irradiating the pattern with ultraviolet rays to fix a hydrogel to the thiol group on the surface of the pattern may be further performed.

In accordance with another exemplary embodiment of the present invention, a PDMS device includes a PDMS structure formed by bonding a first PDMS substrate and a second PDMS substrate at least one of which has a pattern formed thereon, wherein the first PDMS substrate and the second PDMS substrate are bonded by the coupling of a thiol group (—SH) formed on the surface of the first PDMS substrate and an epoxide of the second PDMS substrate, and a thiol group (—SH) is formed on the surface of the pattern.

In another embodiment, among walls constituting the pattern, the thiol group may be formed through a connection body on the surface of a wall configured by the second PDMS substrate, and one end of the connection body may be connected to a hydroxyl group (—OH) on the surface of the second PDMS substrate, whereas the other end of the connection body may be connected to the thiol group while the epoxide ring is opened.

In another embodiment, the pattern may include a first channel formed long in one direction, a second channel branched from the first channel, a switch formed at an end of the second channel, and an electrolyte filled in the first channel, wherein when the switch is pressed, a non-conductive material or air positioned in the second channel may flow into the first channel, so that the electrolyte filled in the first channel may disconnected.

In another embodiment, the pattern may include a channel filled with an electrolyte, and a diode unit formed in the middle of the channel, wherein a p-type hydrogel and an n-type hydrogel are formed facing and in contact with each other in the diode unit, and only the p-type hydrogel is exposed on one side of the channel, whereas only the n-type hydrogel is exposed on the other side of the channel.

BRIEF DESCRIPTION OF THE DRAWINGS

Exemplary embodiments can be understood in more detail from the following description taken in conjunction with the accompanying drawings, in which:

FIG. 1 is a schematic flowchart of a method for manufacturing a PDMS device in accordance with an exemplary embodiment of the present invention;

The accompanying drawings are exemplified by reference for an understanding of the technical idea of the present invention, and the scope of the present invention is not limited thereto.

DETAILED DESCRIPTION OF EMBODIMENTS

Hereinafter, with reference to the drawings, the configuration of the present invention guided by various embodiments of the present invention, and effects resulting from the configuration will be described. In describing the present invention, detailed descriptions of related known functions will be omitted when it is determined that the detailed descriptions may unnecessarily obscure the gist of the present invention that is apparent to those skilled in the art.

Figure 2:
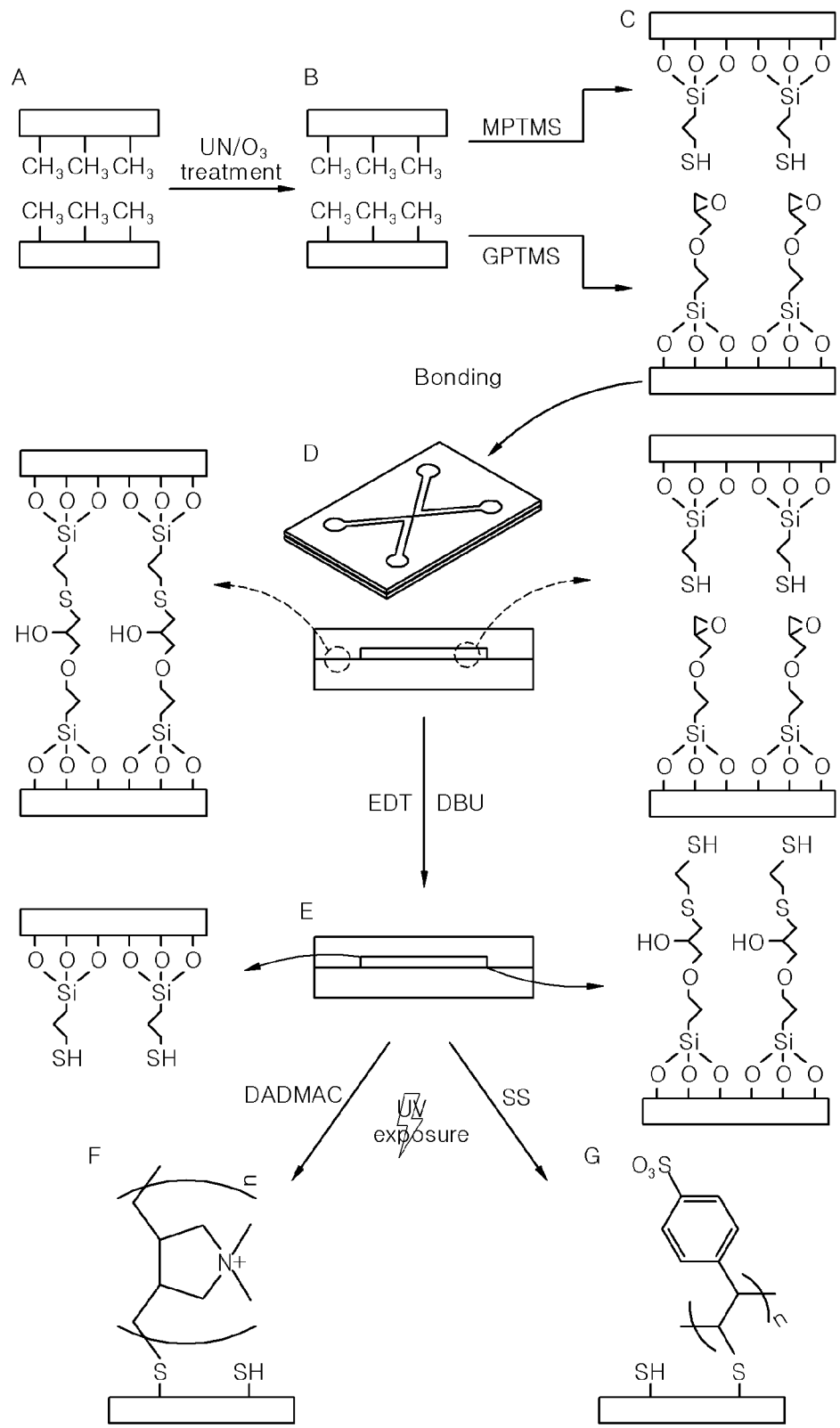
FIG. 2 is a schematic view sequentially illustrating a method for manufacturing a PDMS device in accordance with an exemplary embodiment of the present invention.

FIG. 1 is a schematic flowchart of a method for manufacturing a PDMS device in accordance with an exemplary embodiment of the present invention, and FIG. 2 is a schematic view sequentially illustrating a method for manufacturing a PDMS device in accordance with an exemplary embodiment of the present invention.

Referring to FIG. 1 and FIG. 2, the method for manufacturing a polydimethylsiloxane (PDMS) device in accordance with an exemplary embodiment of the present invention includes (a) preparing a first PDMS substrate and a second PDMS substrate at least one of which has a pattern formed thereon, (b) introducing a —OH group on the surface of the first PDMS substrate and the surface of the second PDMS substrate, (c) introducing a thiol group (—SH) on the surface of the first PDMS substrate, and introducing an epoxide on the surface of the second PDMS substrate, (d) bonding the first PDMS substrate and the second PDMS substrate to form a PDMS structure, and (e) substituting the epoxide present on the surface of the pattern of the PDMS structure with a thiol group.

First, a step of preparing a first PDMS substrate and a second PDMS substrate at least one of which has a pattern formed thereon is performed. The pattern may be formed by a photolithography method, or may be formed using laser etching or a mold, but the present invention is not limited to a particular method in which the pattern is formed.

Like glass, PDMS has transparency and non-toxicity, and furthermore, has advantages of having flexibility and elasticity. However, the surface thereof is hydrophobic unlike that of glass. Therefore, when a pattern is formed on PDMS, and then a hydrogel is formed on the pattern, there is a problem in that the hydrogel is not stabilized and becomes swollen or desorbed, and thus, moves inside a device. Therefore, in order to stabilize the hydrogel, there is a need to modify the surface of the pattern of PDMS on which the hydrogel is formed.

In addition, since a PDMS device is implemented in a form such as one in which a pattern is manufactured in the form of a channel and the like, and an electrolyte is filled in the channel, it is necessary to implement a channel of a tubular form by forming a pattern on a PDMS substrate and covering the pattern with another PDMS substrate. Therefore, a pair of PDMS substrates are prepared, a pattern is then formed on either one thereof, and the PDMS substrates are bonded to each other to manufacture a PDMS device. At this time, there is a need for a method that can stably and cleanly form a fine pattern, while bonding the PDMS substrates. A separate adhesive and the like cannot be used since it is impossible to precisely apply the adhesive and the like along the fine pattern.

The method for manufacturing a PDMS device in accordance with an exemplary embodiment of the present invention bonds the first PDMS substrate and the second PDMS substrate to stably and cleanly form a find pattern, and furthermore, may form a thiol group (—SH) on the surface of the pattern by the bonding of the first PDMS substrate and the second PDMS substrate.

When the first PDMS substrate and the second PDMS substrate at least one of which has a pattern formed thereon are prepared, a step of introducing a —OH group on the surface of the first PDMS substrate and on the surface of the second PDMS substrate is performed. The step of introducing a hydroxyl group (—OH) group on the surface of the first PDMS substrate and on the surface of the second PDMS substrate is performed by irradiating ultraviolet rays in an ozone atmosphere to substitute a methyl group on the surface of PDMS with a hydroxyl group. The ultraviolet rays/ozone oxidation treatment for introducing a hydroxyl group on the first PDMS substrate and on the second PDMS substrate may be performed approximately 2 to 4 hours, and may preferably be performed for approximately 3 hours.

After a hydroxyl group (—OH) is introduced on the surface of the first PDMS substrate and on the surface of the second PDMS substrate, a step of introducing a thiol group (—SH) on the surface of the first PDMS substrate and introducing an epoxide on the surface of the second PDMS substrate is performed.

The step of introducing of a thiol group (—SH) on the surface of the first PDMS substrate may be performed by dissolving at least one selected from the group consisting of (3-Mercaptopropyl)trimethoxysilane, (3-Mercaptopropyl)trimethoxy-d9-silane, and Bis[3-(triethoxysilyl)propyl]tetrasulfide in a solvent, and then immersing the first PDMS substrate therein. As the solvent, ethanol or methanol may be used as an organic solvent. Specifically, the above step may be performed by dissolving approximately 5 to 15 vol % (preferably approximately 5 vol %) of (3-Mercaptopropyl)trimethoxysilane in methanol, and then immersing the first PDMS substrate therein.

The step of introducing of an epoxide on the surface of the second PDMS substrate may be performed by dissolving at least one selected from the group consisting of (3-Glycidyloxypropyl)trimethoxysilane and Diethoxy(3-glycidyloxypropyl)methylsilane in a solvent, and then immersing the second PDMS substrate therein. As the solvent, the same solvent as the above-described solvent used when introducing a thiol group on the first PDMS substrate may be used. Specifically, the above step may be performed by dissolving approximately 5 to 15 vol % (preferably approximately 5 vol %) of (3-Glycidyloxypropyl)trimethoxysilane in methanol, and then immersing the second PDMS substrate therein.

After a thiol group is introduced on the first PDMS substrate and an epoxide is introduced on the second PDMS substrate, a step of bonding the first PDMS substrate and the second PDMS substrate to form a PDMS structure is performed. When the first PDMS substrate and the second PDMS substrate are allowed to come into contact, applied with moderate pressure, and then left to stand at a room temperature, the thiol group and the epoxide react with each other, resulting in firmly bonding the first PDMS substrate and the second PDMS substrate, thereby forming a PDMS substrate. At this time, the pattern formed on the first PDMS substrate or on the second PDMS substrate is maintained spaced apart from the counter substrate. That is, the pattern is still included in the PDMS structure.

After the PDMS structure is formed, a step of introducing a thiol group to the epoxide present on the surface of the pattern is performed. In the step, a compound having 2 or more thiol groups (—SH) is dissolved together with a base in a solvent, and then allowed to come into contact with the pattern, thereby introducing a thiol group while the epoxide ring is opened. The base deprotonates a —SH functional group of the compound having 2 or more thiol groups to increase (—S—) affinity, thereby promoting a reaction with the epoxide. When the epoxide ring opens, protons are brought back, so as a result, it becomes a base-catalyzed reaction.

The compound having 2 or more thiol groups (—SH) may be at least one selected from the group consisting of 1,2-Ethanedithiol, Propanedithiol, 2,3-Dimercapto-1-propanol, Poly(ethylene glycol)dithiolm and 4,4ç, and the base may be at least one selected from the group consisting of 1,8-Diazabicyclo[5.4.0]undec-7-ene, and 1,5-Diazabicyclo[4.3.0]non-5-ene. As the solvent, any one selected from the group of solvents that can be used as the above-described solvent used when introducing a thiol group on the first PDMS substrate may be used. Specifically, the above step may be performed by dissolving approximately 2 to 5 vol % (preferably approximately 3.5 vol %) of 1,2-Ethanedithiol and approximately 2 to 4 vol % (preferably 2.5 vol %) of (1,8-Diazabicyclo[5.4.0]undec-7-ene) in methanol, and then injecting the mixture into the pattern, or immersing the second PDMS substrate therein.

Ultimately, a thiol group is present on the entire surface of the pattern.

After the PDMS device is manufactured as described above, a monomolecular solution composition of a gel for forming a hydrogel, such as poly(Diallyldimethylammonium chloride) (pDADMAC) or poly(Styrenesulfonate) (pSS), is positioned at a desired position, and then irradiated with ultraviolet rays to fix a hydrogel at the position. At this time, PDMS has high transparency, so that there is an advantage in that ultraviolet rays may be efficiently irradiated.

In conclusion, the thiol group formed on the surface of the pattern and a hydrogel are connected by a covalent bond through a thiol-ene reaction caused by the irradiation of ultraviolet rays, which serves to allow the hydrogel to be stably positioned inside the pattern.

A PDMS device may be manufactured by the above-described method for manufacturing a PDMS device in accordance with an exemplary embodiment of the present invention. A PDMS device in accordance with another exemplary embodiment of the present invention includes a PDMS structure formed by bonding a first PDMS substrate and a second PDMS substrate at least one of which has a pattern formed thereon, wherein the first PDMS substrate and the second PDMS substrate by the coupling of a thiol group (—SH) formed on the surface of the first PDMS substrate and an epoxide of the second PDMS substrate, and a thiol group (—SH) is formed on the surface of the pattern.

The PDMS device in accordance with another exemplary embodiment of the present invention has flexibility and biocompatibility unlike glass, and thus, has an advantage of being able to be used as a device for a living body, whereas it is difficult to use a device made of glass for a living body, or being able to implement a device having a new structure.

Figure 3:
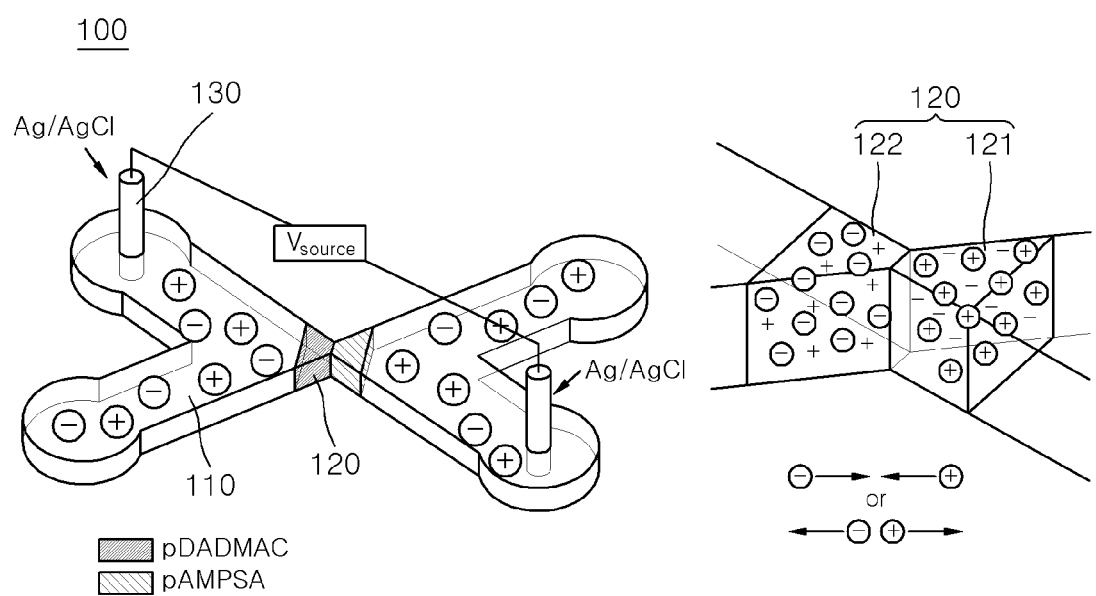
FIG. 3 is a reference view for describing an operation of a PDMS diode device manufactured by a method for manufacturing a PDMS device in accordance with an exemplary embodiment of the present invention.
Figure 4:
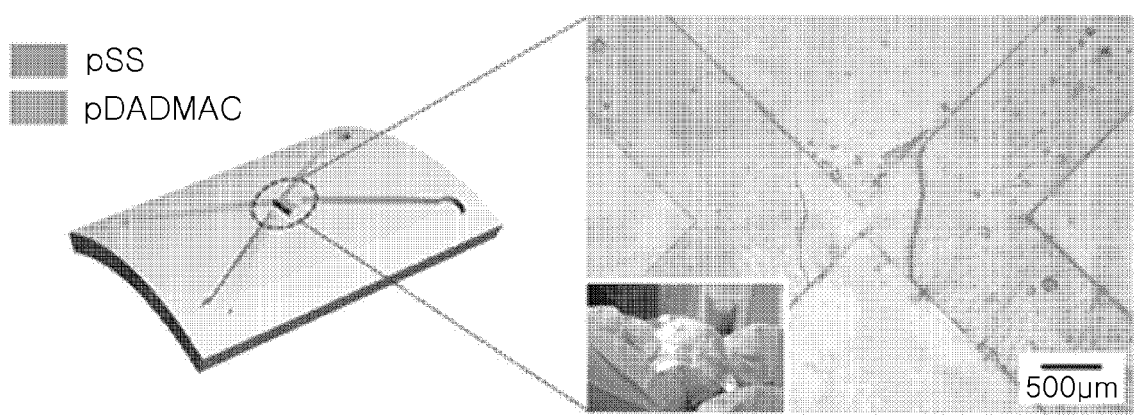
FIG. 4 is a schematic view of a case in which a PDMS diode device manufactured by a method for manufacturing a PDMS device in accordance with an exemplary embodiment of the present invention is bent, and an image of a diode unit captured at the time.

FIG. 3 is a reference view for describing an operation of a PDMS diode device manufactured by a method for manufacturing a PDMS device in accordance with an exemplary embodiment of the present invention, and FIG. 4 is a schematic view of a case in which a PDMS diode device manufactured by a method for manufacturing a PDMS device in accordance with an exemplary embodiment of the present invention is bent, and an image of a diode unit captured at the time.

A PDMS diode device 100 is formed in a form in which a pattern includes a channel 110 and a diode unit 120 formed in the middle of the channel 110. In the diode unit 120, a p-type hydrogel 121 and an n-type hydrogel 122 are formed facing and in contact with each other. At this time, only the p-type hydrogel is exposed on one side of the channel, whereas only the n-type hydrogel is exposed on the other side of the channel. An electrode 130 is positioned on both sides of the channel 110. At this time, a hydrogel is stably fixed by the coupling with a thiol group formed on the surface of the channel of the PDMS diode device 100.

The operation of the above-described PDMS diode device 100 is disclosed in Patent Laid-Open Publication No.

10-2143185, and here, unique characteristics of a case in which PDMS is used will be described.

Figure 5:
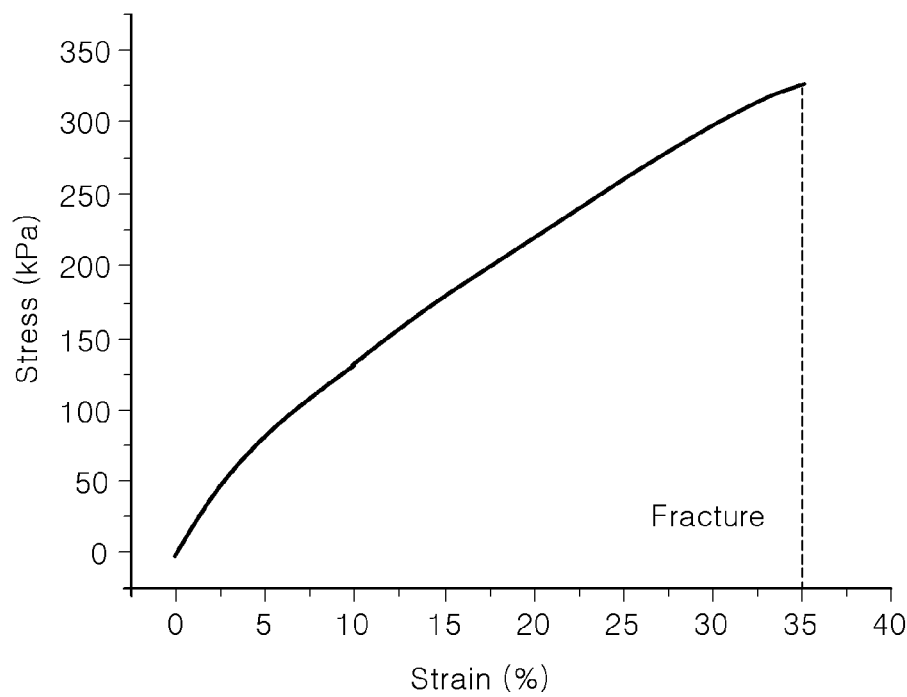
FIG. 5 is a result showing the degree of deformation according to tensile force applied to a PDMS diode device manufactured by a method for manufacturing a PDMS device in accordance with an exemplary embodiment of the present invention.
Figure 6:
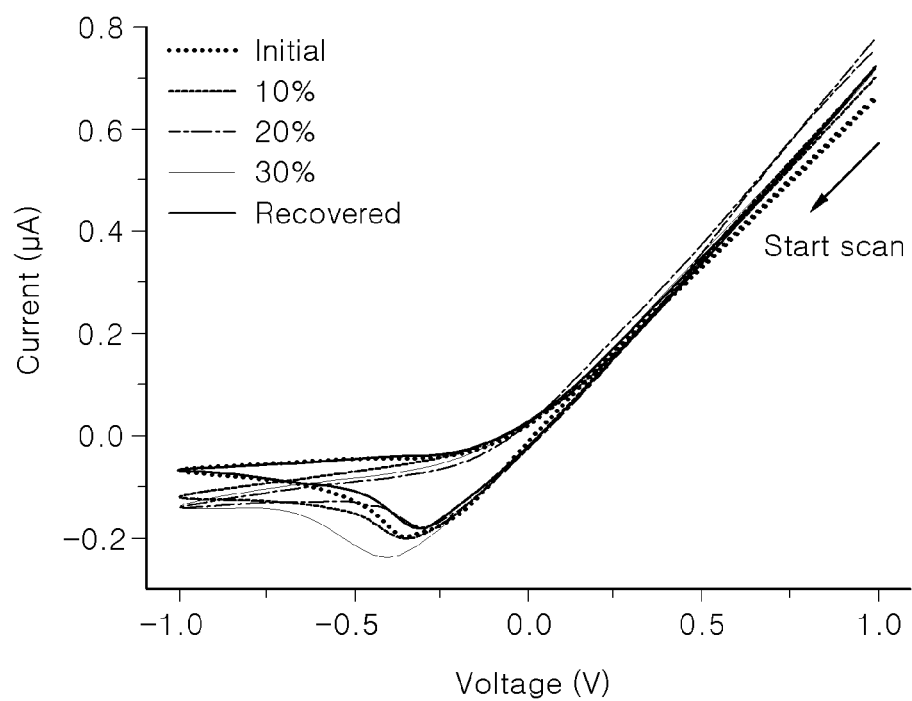
FIG. 6 is a result of measuring whether performance is maintained when a PDMS diode device manufactured by a method for manufacturing a PDMS device in accordance with an exemplary embodiment of the present invention is bent and then recovered.

As shown in FIG. 4, the PDMS diode device 100 of the present invention has the advantage of being bendable. That is, it can be seen that the PDMS device is bent according to a predetermined level of external force. Furthermore, as shown in FIG. 5 and FIG. 6, it can be seen that the rectifying function of the diode is maintained normally regardless of such deformation and recovery, and the initial performance is recovered even when recovering from tensile force.

Figure 7:
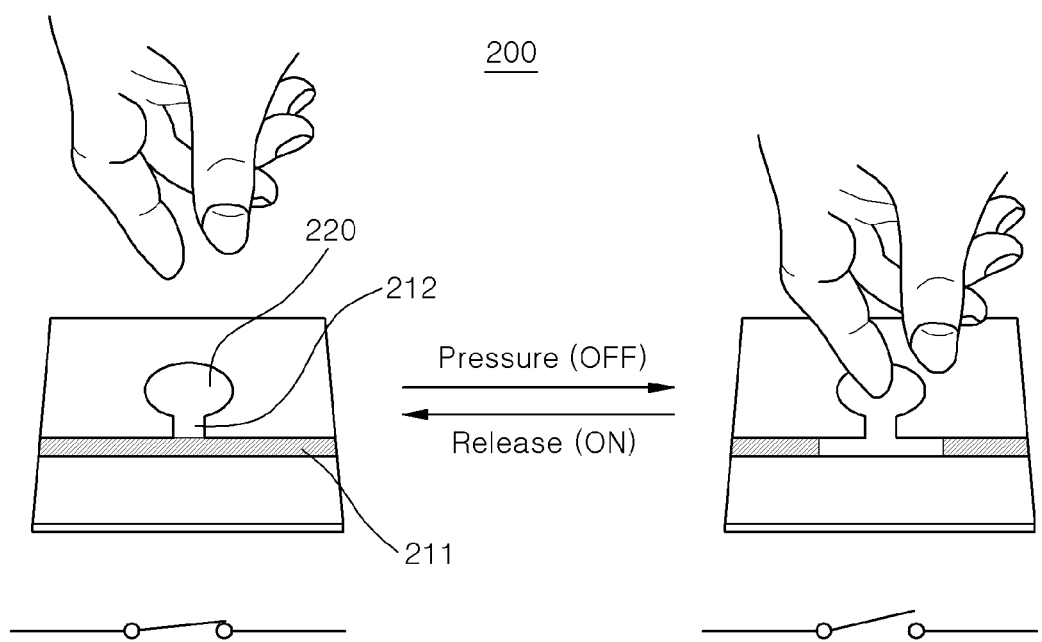
FIG. 7 is a reference view schematically illustrating the configuration and shape of a PDMS switch device manufactured by a method for manufacturing a PDMS device in accordance with an exemplary embodiment of the present invention.

FIG. 7 is a reference view schematically illustrating the configuration and shape of a PDMS switch device manufactured by a method for manufacturing a PDMS device in accordance with an exemplary embodiment of the present invention.

A PDMS switch device 200 includes a first channel 211 having a pattern formed long in one direction, a second channel 211 branched from the first channel 211, a switch 220 formed at an end of the second channel 212. The first channel 211 is filled with an electrolyte containing ions, and a current flows by the movement of the ions. On the contrary, the second channel 212 and the switch 220 are not filled with an electrolyte. Therefore, when the switch 220 is pressed, a non-conductive material or air flows into the first channel 211, so that the electrolyte filled in the first channel 211 is disconnected.

Figure 8:
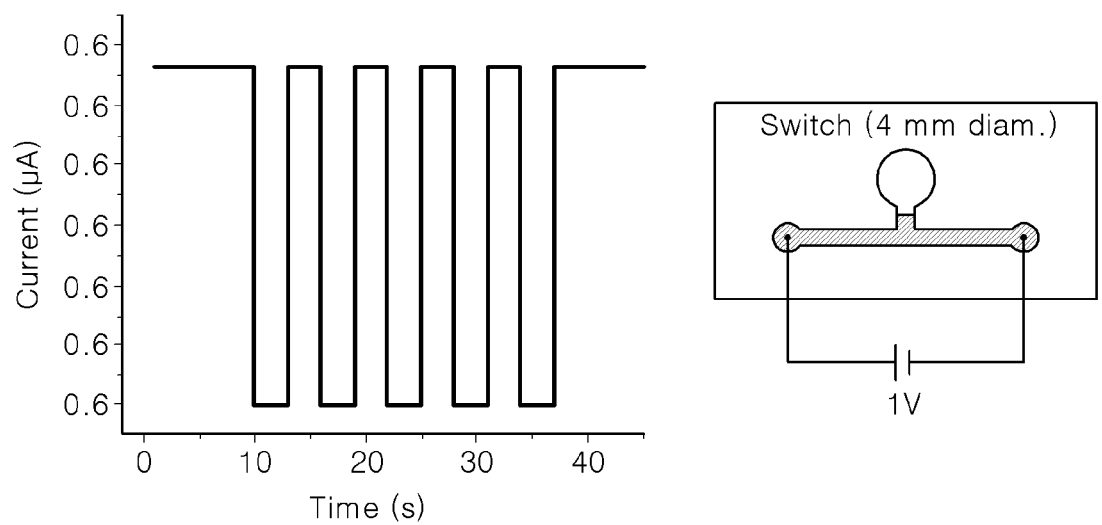
FIG. 8 is a result of measuring a current according to an operation of a PDMS switch device manufactured by a method for manufacturing a PDMS device in accordance with an exemplary embodiment of the present invention.

That is, the PDMS switch device 200 may operate as a switch using the flexibility and elastic force of PDMS. In conclusion, results as shown in FIG. 8 may be obtained by the operation of the switch 220.

Figure 9:
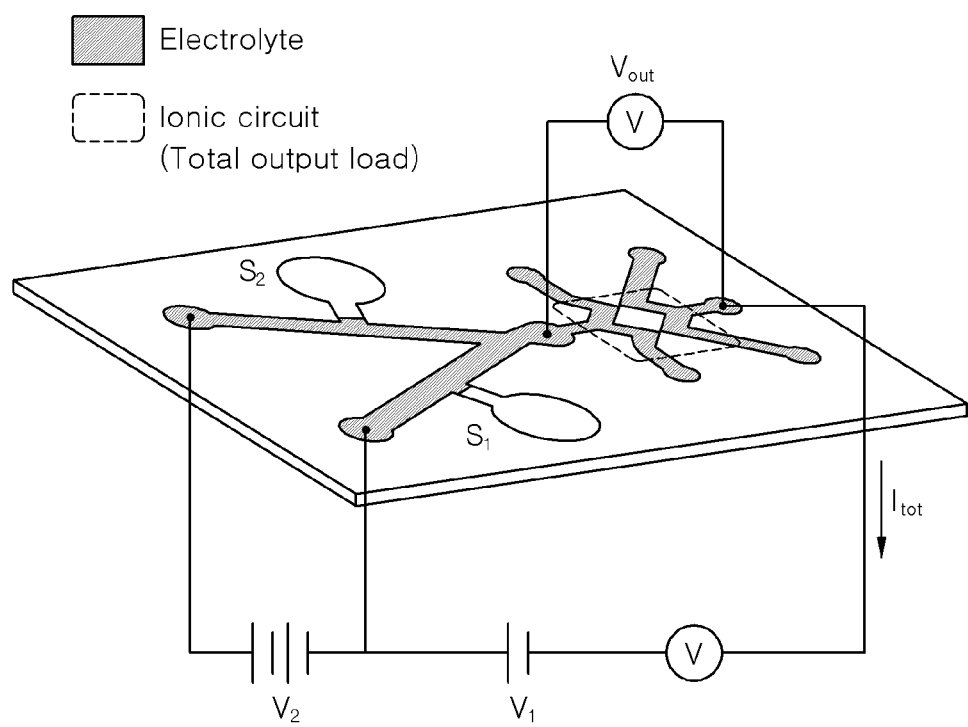
FIG. 9 is a reference view of a PDMS multi-power output control device manufactured by a method for manufacturing a PDMS device in accordance with an exemplary embodiment of the present invention.
Figure 10:
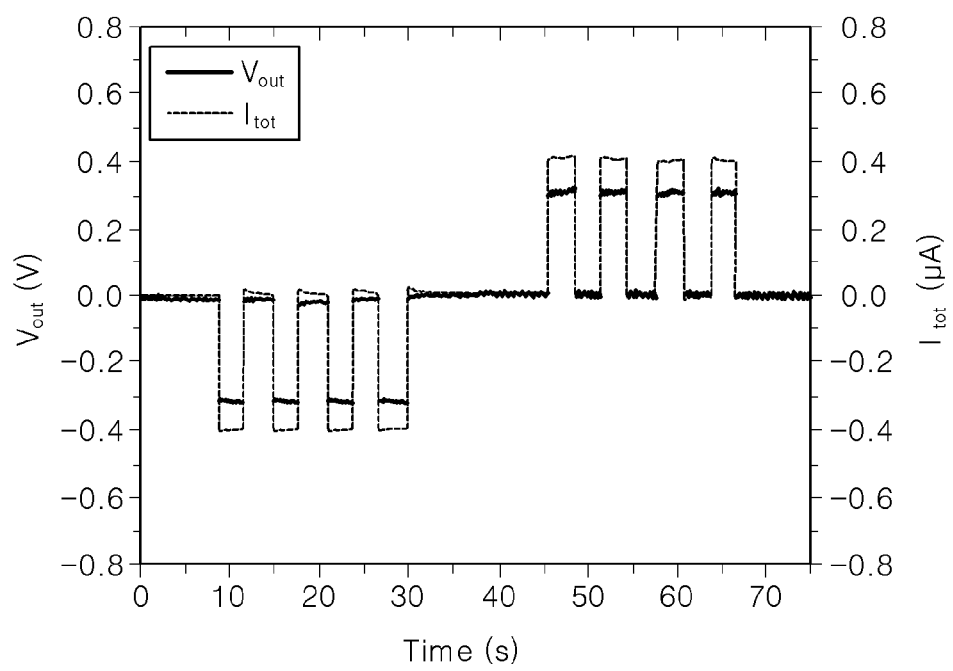
FIG. 10 is a result of measuring a current according to an operation of a PDMS multi-power output control device manufactured by a method for manufacturing a PDMS device in accordance with an exemplary embodiment of the present invention.

FIG. 9 is a reference view of a PDMS multi-power output control device manufactured by the method for manufacturing a PDMS device in accordance with an exemplary embodiment of the present invention, and FIG. 10 is a result of measuring a current according to an operation of the PDMS multi-power output control device manufactured by the method for manufacturing a PDMS device in accordance with an exemplary embodiment of the present invention.

The PDMS multi-power output control device is provided with a first switch S1 and a second switch S2, and thus, has the advantage of being able to adjust power output according to the operation of the first switch S1 and the second switch S2.

A method for manufacturing a PDMS device in accordance with an exemplary embodiment of the present invention introduces a hydroxyl group (—OH) on the surface of a first PDMS substrate and the surface of a second PDMS substrate both having fine patterns formed thereon, and then introducing a thiol group (—SH) on the surface of the first PDMS substrate, and introducing an epoxide on the surface of the second PDMS substrate. Thereafter, by allowing the first PDMS substrate and the second PDMS substrate to come into contact, thereby coupling the thiol group and the epoxide on the respective substrate, the first PDMS substrate and the second PDMS substrate are bonded to each other to form a PDMS structure having a pattern. Next, a thiol group (—SH) is introduced on the surface of the pattern.

In the method for manufacturing a PDMS device in accordance with an exemplary embodiment of the present invention, the surface of a pattern is all surface-treated with a thiol group (—SH), so that a hydrogel may be connected to the surface of the pattern by a covalent bond under ultraviolet rays. Therefore, a PDMS device manufactured by the above method has an advantage in that the shape thereof may be stably maintained without the swelling or desorption of a hydrogel even when an electrolyte is filled in a pattern.

Meanwhile, although not explicitly stated herein, it should be understood that effects described in the following specification that are expected by the technical features of the present invention and their provisional effects are treated as described in the specification of the present invention.

The scope of protection of the present invention is not limited to the description and expression of the embodiments explicitly described above. In addition, it should be added once again that the scope of protection of the present invention may not be limited due to obvious changes or substitutions in the technical field to which the present invention pertains.

What is claimed is:

1. A method for manufacturing a PDMS device, the method comprising:
   (a) preparing a first PDMS substrate and a second PDMS substrate at least one of which has a pattern formed thereon;
   (b) introducing a hydroxyl group (—OH) on the surface of the first PDMS substrate and the surface of the second PDMS substrate;
   (c) introducing a first thiol group (—SH) on the surface of the first PDMS substrate, and introducing an epoxide on the surface of the second PDMS substrate;
   (d) bonding the first PDMS substrate and the second PDMS substrate to form a PDMS structure; and
   (e) substituting the epoxide present on the surface of the pattern of the PDMS structure with a thiol group.

2. The method of claim 1, wherein Step (b) is performed by irradiating the first PDMS substrate and the second PDMS substrate with ultraviolet rays in an ozone atmosphere.

3. The method of claim 1, wherein the introducing of a first thiol group (—SH) on the surface of the first PDMS substrate in Step (c) is performed by dissolving at least one selected from the group consisting of (3-Mercaptopropyl) trimethoxysilane, (3-Mercaptopropyl)trimethoxy-d9-silane, and Bis[3-(triethoxysilyl)propyl]tetrasulfide in a solvent, and then immersing the first PDMS substrate therein.

4. The method of claim 1, wherein the introducing of an epoxide on the surface of the second PDMS substrate in Step (c) is performed by dissolving at least one selected from the group consisting of (3-Glycidyloxypropyl)trimethoxysilane and Diethoxy(3-glycidyloxypropyl)methylsilane in a solvent, and then immersing the second PDMS substrate therein.

5. The method of claim 1, wherein Step (e) is one in which a compound having 2 or more thiol groups (—SH) is dissolved together with a base in a solvent, and then allowed to come into contact with the pattern, thereby introducing a second thiol group while the epoxide ring is opened.

6. The method of claim 5, wherein:
   the compound having 2 or more thiol groups (—SH) is at least one selected from the group consisting of 1,2-Ethanedithiol, Propanedithiol, 2,3-Dimercapto-1-propanol, Poly(ethylene glycol)dithiolm and 4,4ç; and
   the base is at least one selected from the group consisting of 1,8-Diazabicyclo[5.4.0]undec-7-ene, and 1,5-Diazabicyclo[4.3.0]non-5-ene.

7. The method of claim 1, further comprising, after Step (e) is performed, injecting a hydrogel monomolecular aqueous solution at one position of the pattern, and then irradiating the pattern with ultraviolet rays to fix a hydrogel to the thiol group on the surface of the pattern.

* * * * *